United States Patent [19]

Taguchi

[11] Patent Number: 5,296,331
[45] Date of Patent: Mar. 22, 1994

[54] IMAGE RECEIVING MATERIAL CONTAINING PARTICLES OF THERMOPLASTIC COMPOUND

[75] Inventor: Keiichi Taguchi, Kanagawa, Japan

[73] Assignee: Fuji Photo Film Co., Ltd., Kanagawa, Japan

[21] Appl. No.: 29,389

[22] Filed: Mar. 10, 1993

[30] Foreign Application Priority Data

Mar. 11, 1992 [JP] Japan .................... 4-052730

[51] Int. Cl.$^5$ ............. G03C 5/54; B41L 1/20
[52] U.S. Cl. ............... 430/253; 427/180; 427/195; 428/206; 428/304.4; 428/308.4; 428/315.7; 428/407; 430/138; 430/203; 430/207; 430/213; 430/254; 430/255; 503/207; 503/214
[58] Field of Search ............ 430/138, 207, 203, 213, 430/253, 254, 255; 503/207, 214; 428/206, 308.4, 304.4, 315.7, 407; 427/195, 180

[56] References Cited

U.S. PATENT DOCUMENTS

| | | | |
|---|---|---|---|
| 4,554,235 | 11/1985 | Adair et al. | 430/138 |
| 4,772,532 | 9/1988 | Adair et al. | 430/138 |
| 4,784,932 | 11/1988 | Nakamura et al. | 430/138 |
| 4,859,561 | 8/1989 | Metz et al. | 430/138 |
| 4,970,193 | 11/1990 | Liang et al. | 430/138 |
| 5,030,539 | 7/1991 | Kintz et al. | 430/138 |
| 5,071,823 | 12/1991 | Matsushita et al. | 430/138 |

*Primary Examiner*—Richard L. Schilling
*Attorney, Agent, or Firm*—Sughrue, Mion, Zinn, Macpeak & Seas

[57] ABSTRACT

An image receiving material comprises an image receiving layer provided on a support. The image receiving layer contains particles of a thermoplastic compound. The image receiving layer has a porous surface formed by the particles. According to the present invention, the image receiving material is prepared by forming the image receiving layer on the support and heating the image receiving layer at a temperature of higher than a softening point of the thermoplastic compound to widen pores in the porous surface. The image receiving material is preferably used in combination with a light-sensitive material which comprises a support and a light-sensitive layer in which light-sensitive microcapsules are dispersed. The light-sensitive microcapsules contain silver halide, a reducing agent, an ethylenically unsaturated polymerizable compound and a color image forming substance. An image forming process using the light-sensitive material and the image receiving material of the present invention comprises the steps of imagewise exposing to light the light-sensitive material; heating the light-sensitive material to develop the silver halide; and pressing the light-sensitive material on the image receiving material to form a color image on the image receiving material.

16 Claims, No Drawings

IMAGE RECEIVING MATERIAL CONTAINING PARTICLES OF THERMOPLASTIC COMPOUND

FIELD OF THE INVENTION

The present invention relates to an image receiving material which comprises an image receiving layer provided on a support.

BACKGROUND OF THE INVENTION

Image receiving materials have been used in various image forming processes, which comprises pressing or heating an image recording material on an image receiving material to transfer an image from the recording material to the receiving material. The pressing or heating procedures can be easily handled.

Examples of the processes using the image receiving materials include a pressure sensitive copying process, an electrophotography, a thermal image transfer process, a heat sublimate process and various light-sensitive image forming processes. The photosensors of the light-sensitive image forming processes include a photopolymerization initiator, a photodecomposition resin and silver halide. Processes using a photopolymerization initiator are disclosed in U.S. Pat. Nos. 4,440,846 (Sanders et al.) and 4,483,912 (Sanders). Processes using silver halide are U.S. Pat. No. 4,629,676 (Hayakawa et al.) and U.S. Pat. No. 4,912,011 (Yamamoto et al.).

The process using silver halide comprises the steps of imagewise exposing to light a light-sensitive material; heating the light-sensitive material to develop silver halide; and pressing the light-sensitive material on the image receiving material to form a color image on the image receiving material. The light-sensitive material comprises a support and a light-sensitive layer in which light-sensitive microcapsules are dispersed. The light-sensitive microcapsules contain silver halide, a reducing agent, an ethylenically unsaturated polymerizable compound and a color image forming substance. At the heat development, the polymerizable compound is usually hardened within the area where the latent image of silver halide has been formed. U.S. Pat. No. 5,166,040 (Takeda) discloses another image forming process in which the polymerizable compound is hardened within the area where a latent image has not been formed.

With respect to the process using a photopolymerization initiator, U.S. Pat. No. 4,554,235 (Adair et al.) discloses a specific image receiving material. The image receiving material comprises a support, an image receiving layer and a discontinuous layer of a thermoplastic polymeric pigment. After an image is transferred to the image receiving material, the material is heated to form a thin essentially transparent polymeric film made from the thermoplastic polymeric pigment on the transferred image.

With respect to the process using silver halide, U.S. Pat. No. 4,784,932 (Nakamura et al.) discloses another specific image receiving material. The image receiving material comprises a support and an image receiving layer containing a granulated thermoplastic compound. After an image is transferred to the image receiving material, the material is heated to obtain a glossy or transparent image contained in a film made from the thermoplastic compound.

Using the image receiving materials disclosed in U.S. Pat. Nos. 4,554,235 and 4,772,532, a glossy image can be obtained if the supports of the image receiving materials are opaque. If the supports are transparent, a transparent image can be obtained. The particles of the thermoplastic compound have another function of forming a porous surface on the image receiving layer. The pores increase the color density of the transferred image because they increase the amount of the transferred color image forming substance.

SUMMARY OF THE INVENTION

The applicant studied the image receiving materials disclosed in U.S. Pat. Nos. 4,554,235 and 4,772,532. The applicant notes, however, that the color density of the transferred image is still insufficient, even though the density has been increased by the pores formed with the particles of the thermoplastic compound.

An object of the present invention is to provide an image receiving material which forms a clear transferred image having a high color density.

There is provided by the present invention an image receiving material which comprises an image receiving layer provided on a support, said image receiving layer containing particles of a thermoplastic compound, and said layer having a porous surface formed by the particles, wherein the image receiving material is prepared by forming the image receiving layer on the support and heating the image receiving layer at a temperature of higher than a softening point of the thermoplastic compound to widen pores in the porous surface.

The image receiving layer preferably further contains porous particles.

There is also provided by the invention an image process comprises the steps of:

imagewise exposing to light a light-sensitive material which comprises a support and a light-sensitive layer in which light-sensitive microcapsules containing silver halide, a reducing agent, an ethylenically unsaturated polymerizable compound and a color image forming substance are dispersed;

heating the light-sensitive material to develop the silver halide;

and pressing the light-sensitive material on an image receiving material which comprises an image receiving layer provided on a support, said image receiving layer containing particles of a thermoplastic compound, and said layer having a porous surface formed by the particles, to form a color image on the image receiving material, wherein the image receiving material is prepared by forming the image receiving layer on the support and heating the image receiving layer at a temperature of higher than a softening point of the thermoplastic compound to widen pores in the porous surface.

The image receiving material of the present invention is characterized in that the image receiving layer is heated at a temperature of higher than a softening point of the thermoplastic compound to widen pores in the porous surface. The applicant notes that the diameter of the open of the pore is increased by heating the image receiving layer.

According to study of the applicant, the pores formed with the particles have a variety of sizes. Relatively small pores do not effect on the density of the image, since the transferred substances are trapped in only relatively large pores because the substances are viscous. When the image receiving layer is heated, the particles of the thermoplastic compound (having a relatively small particle size) are partially melted, and the small pores are fused to form large pores. Accordingly, the pores are widened, namely the diameter of the open of the pore is increased.

As a result, the amounts of the transferred color image forming substances are increased. Therefore, the image receiving material of the present invention forms a clear transferred image having a high color density. This effect of the invention is more improved where the image receiving layer further contains porous particles.

DETAILED DESCRIPTION OF THE INVENTION

The image receiving material of the present invention is prepared by forming an image receiving layer containing particles of a thermoplastic compound on the support and heating the image receiving layer at a temperature of higher than a softening point of the thermoplastic compound. The image receiving layer is usually formed by coating a dispersion of the particles of the thermoplastic compound on the support, and drying the image receiving layer at a temperature of lower than the softening point of the thermoplastic compound.

In the present specification, the term "temperature" means the surface temperature of the image receiving layer.

After the image receiving layer is formed, the image receiving layer is heated at a temperature of higher than the softening point of the thermoplastic compound. The heating temperature is preferably at least 10° C., and more preferably at least 20° C. higher than the softening point of the thermoplastic compound. In the case that the thermoplastic compound has a glasstransition point (Tg), the heating temperature is preferably also higher than the glasstransition point.

The image receiving layer is heated preferably at a low relative humidity, for example, of not more than 70 and more preferably of not more than 50%.

The heating time is preferably not shorter than 30 seconds, and more preferably not shorter than 1 minute.

The image receiving material is preferably indirectly heated with heating means. In other words, the heating means are preferably out of contact with the image receiving material. Examples of such indirect heating means include electromagnetic waves, infrared rays and hot air.

The thermoplastic compound has a softening point preferably in the range of 30° to 200° C., and more preferably in the range of 50° to 150° C. In the case that the thermoplastic compound has a glasstransition point, the glasstransition point is preferably in the range of 0° to 180° C., and more preferably in the range of 20° to 150° C.

Examples of the thermoplastic compounds include polyethylene (preferably amorphous), ionomer, polypropylene (preferably amorphous), polystyrene, poly-α-methylstyrene, polymethyl acrylate, polymethyl methacrylate, polyethyl acrylate, polyethyl methacrylate, polybutyl acrylate, polybutyl methacrylate, polyvinyl acetate, polyvinyl chloride, polyvinylidene chloride, polyacrylonitrile, polyamide, polyester, polyvinyl butyral, polyvinyl formal, polyurethane, ethyl cellulose, cellulose acetate and copolymers thereof. Examples of the copolymers include ethylene-vinyl acetate copolymer, ethylene-acrylic acid copolymer, ethylene-acrylic ester copolymer, ethylene-methacrylic ester copolymer, α-methylstyrene-vinyl toluene copolymer, styrene-butadiene copolymer, styrene-methyl methacrylate copolymer, styrene-methacrylic acid copolymer, styrene-acrylonitrile copolymer, styrene-acrylate copolymer, methyl methacrylate-methacrylate copolymer, 2-ethylhexyl acrylate-methacrylate copolymer, ethylacrylateacrylic acid copolymer, methyl methacrylate-methacrylic acid copolymer, vinyl acetate-vinyl chloride copolymer, vinylidene chloride-vinyl chloride copolymer and vinylidene chloride-acrylonitrile copolymer.

A thermoplastic resin having a low molecular weight is also available as the thermoplastic compound of the present invention. Examples of the thermoplastic resins include rosin, rosin modified resin, hydrogenated rosin, styrene modified polyterpene resin, styrene modified petroleum resin, petroleum unsaturated hydrocarbon, styrene resin, terpene-phenol, aliphatic hydrocarbon resin, cyclopentadiene resin, modified phenol resin, alkylphenol resin and alkylphenol-acetylene resin.

A wax is also available as the thermoplastic compound of the invention. Examples of the waxes include beeswax, caster wax, stearic acid, glycerol monostearate, stearamide, stearyl alcohol, palmitic acid, a hardened oil and a hardened fat.

Two or more thermoplastic compounds can be used in combination.

The thermoplastic compound is used in the form of particles. The particles of the thermoplastic compound have an average particle size preferably in the range of 0.01 to 100 μm, and more preferably in the range of the 0.1 to 50 μm.

The image receiving layer preferably contains a binder in addition to the particles of the thermoplastic compound. The binder preferably is a transparent or semi-transparent hydrophilic polymer or an aqueous latex. Various natural or synthetic polymers are available as the hydrophilic polymer.

Examples of the natural hydrophilic polymers include gelatin, gelatin derivatives, cellulose derivatives (e.g., carboxymethyl cellulose and methyl cellulose), starch, sodium alginate, carrageenan, pectin and gum arabic. Examples of the synthetic hydrophilic polymers include polyvinyl alcohol, polyvinyl pyrrolidone, polyacrylamide, polyethylene oxide, polyvinyl ether, polyacrylic salt, polymethacrylic salt, polystyrenesulfonic salt, polystyrenesulfinic salt, a salt of polyvinylsulfric ester, maleic acid polymer and maleic anhydride polymer.

Examples of the aqueous latexes include styrene-butadiene copolymer latex, acrylic latex, styrene-acrylic ester latex, acrylonitrile latex, polyethylene latex, polystyrene latex, ethylene-vinyl acetate copolymer latex, ethylenevinyl chloride latex, polyvinylidene chloride latex. An inorganic polymer such as colloidal silica is also available as the binder.

The image receiving layer preferably contains the binder in an amount of 0.05 to 2 g, and more preferably in an amount of 0.1 to 1 g based on 1 g of the thermoplastic compound.

Various inorganic or organic white pigments may be added to the image receiving layer. The white pigments have a function of increasing the absorption of the transferred oily substances.

Examples of the inorganic white pigments include natural mineral pigments (e.g., clay, talc, kaolin and ground (heavy) calcium carbonate), oxides (e.g., silicon oxide, titanium dioxide, zinc oxide, magnesium oxide and aluminum oxide), salts of alkaline earth metals (e.g., magnesium sulfate, barium sulfate, calcium sulfate, magnesium carbonate, barium carbonate, precipitated (light) calcium carbonate, calcium silicate, magnesium hydroxide, magnesium phosphate and magnesium hydrogenphosphate) and the other pigments (e.g., aluminum silicate, aluminum hydroxide, zinc sulfide, zeolite, acid clay, active clay and glass).

Examples of the organic white pigments include polyethylene resin, polystyrene resin, benzoguanamine resin, urea-formalin resin, melamine-formalin resin and polyamide resin.

Two or more white pigments can be used in combination. The white pigments preferably have an average particle size in the range of 0.1 to 20 μm, and more preferably in the range of 2 to 10 μm. The image receiving layer preferably contains the white pigments in an amount of 0.001 to 2 g, and more preferably of 0.1 to 0.5 g based on 1 g of the thermoplastic compound.

The image receiving layer preferably further contains porous particles. The porous particles preferably have an average diameter in the range of 0.1 to 100 μm. Various organic or inorganic particles are available as the porous particles. The particles are preferably made of a compound having a high softening point, which is higher than the heating temperature of the image receiving material.

The porous particles have a function of keeping the porous structure of the thermoplastic particles to prevent the structure from melting.

Examples of the inorganic porous particles are aggregation of white pigments such as silicone oxide and calcium carbonate. Examples of the organic porous particles are various cross-linked plastic particle such as cross-linked polystyrene and cross-linked polymethyl methacrylate.

The image receiving layer contains the porous particles in an amount of 0.1 to 60 g/m².

The image receiving layer may further contain various components other than the thermoplastic compound, the binder and the white pigment.

For example, a color developer can be contained in the image receiving layer in the case that a color formation system uses a color former such as a leuco dye as a color image forming substance.

In the case that a leuco dye having a partial structure of lactone, lactam or spiropyran is used as a color image forming substance (color former), a phenol resin compound or a zinc salicylate derivative is preferably used in the form of particles. The color developer is preferably contained in the image receiving layer in a coating amount of 0.1 to 50 g/m², more preferably 0.5 to 20 g/m².

The image receiving layer may further contain a mordening agent, a dye or pigment (which does not relate to image formation), a thermal polymerization initiator or a photopolymerization initiator.

The image receiving layer preferably has a thickness in the range of 0.5 to 50 μm, and more preferably in the range of 3 to 30 μm.

The image receiving material may further have a protective layer on the image receiving layer.

Examples of the substances for preparation of the supports include glass, paper, fine paper, coat paper, castcoat paper, baryta paper, synthetic paper, metals and analogues thereof, films of polyester, acetyl cellulose, cellulose ester, polyvinyl acetal, polystyrene, polycarbonate and polyethylene terephthalate, and paper laminated with resin or polymer (e.g., polyethylene). In the present invention, a paper support is preferably used as the support of the image receiving material.

The image receiving material can be prepared by coating a dispersion of particles of the thermoplastic compound on the support to form an image receiving layer on the support. The particles are preferably dispersed in a solution of a binder to prepare a coating solution of the image receiving layer. The other components such as a color developer may be dissolved, emulsified or dispersed in the dispersion of the particles.

The image receiving material of the present invention may be used in various image forming processes. The image receiving material is advantageously used in a light-sensitive image forming process. One embodiment of the process uses a light-sensitive material comprising a light-sensitive layer containing a photopolymerization initiator, an ethylenically unsaturated polymerizable compound and a color image forming substance provided on a support (which is hereinafter referred to as "first embodiment"). The photopolymerization initiator, the polymerizable compound and the color image forming substance are preferably contained in light-sensitive microcapsules which are dispersed in the light-sensitive layer. Another embodiment of the process uses a light-sensitive material comprising a light-sensitive layer containing silver halide, a reducing agent, an ethylenically unsaturated polymerizable compound and a color image forming substance (which is hereinafter referred to as "second embodiment"). The silver halide, the reducing agent, the polymerizable compound and the color image forming substance are preferably contained in light-sensitive microcapsules which are dispersed in the light-sensitive layer.

The photopolymerization initiator, the ethylenically unsaturated polymerizable compound and the color image forming substance used in the first embodiment are described below.

Examples of the photopolymerization initiators include α-alkoxyphenyl ketones, polycyclic quinones, benzophenones and substituted benzophenones, xanthones, thioxanthones, halogenated compounds (e.g., chlorosulfonyl and chloromethyl polycyclic aromatic compounds, chlorosulfonyl and chloromethyl heterocyclic compounds, chlorosulfonyl and chloromethyl benzophenones, and chlorosulfonyl and chloromethyl fluorenones), haloalkanes, α-halo-α-phenylacetophenones, redox couples of a photoreducible dye and a reducing agent, halogenated paraffins (e.g., brominated or chlorinated paraffin), benzoalkyl ethers, rofindimermercapto compound couples and organic boron compound anionic salts of organic cationic compounds.

Preferred examples of the photopolymerization initiators include 2,2-dimethoxy-2-phenylacetophenone, 9,10-anthraquinone, benzophenone, Michler's ketone, 4,4'-diethylaminobenzophenone, xanthone, chloroxanthone, thioxanthone, chlorothioxanthone, 2,4-diethylthioxanthone, chlorosulfonylthioxanthone, chlorosulfonylanthraquinone, chloromethylanthraquinone, chloromethylbenzothiazole, chlorosulfonylbenzoxazole, chloromethylquinoline, chloromethylbenzophenone, chlorosulfonylbenzophenone, fluorenone, carbon tetrabromide, benzoisobutylether, benzoynisopropylether and a combination of 2,21-bis(o-chlorophenyl)-4,4',5,5'-tetraphenylbiimidazole with 2-mercapto-5-methylthio-1,3,4-thiadiazole.

Two or more photopolymerization initiators can be used in combination.

The photopolymerization initiator is preferably used in an amount of 0.5 to 30 wt. %, and more preferably 2 to 20 wt. % based on the amount of the polymerizable compound.

There is no specific limitation on the color image forming substance. Examples of the color image forming substance include colored substance (i.e., dyes and pigments) and non-colored or almost non-colored substance (i.e., color former or dye- or pigment-precursor) which develops to give a color under application of external energy (e.g., heating, pressing, light irradiation) or by contact with other components (i.e., developer). Examples of dyes and pigments (i.e., colored substance) employable in the invention include commercially available ones as well as various known compounds described in the technical publications, for example, Yuki Gosei Kagaku Kyokai (ed.), Handbook of Dyes (in Japanese, 1970) and Nippon Ganryo Gijutsu Kyokai(ed.), New Handbook of pigments (in Japanese, 1977). Those dyes and pigments can be used in the form of a solution or dispersion.

Examples of the substances which develop to give a color by certain energy include thermochromic compounds piezochromic compounds, photochromic compounds and leuco compounds derived from triarylmethane dyes, quinone dyes, indigoid dyes or azine dyes. Those compounds can develop to give a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of color formation systems are described in Hiroyuki Moriga, "Introduction of Chemistry of Speciality Paper" (in Japanese, 1975), pp. 29-58 (pressure-sensitive copying paper, [pp. 87-95 (azo-graphy), pp. 118-120 (heat-sensitive color formation by a chemical change) or in MSS. of the seminar promoted by the Society of Kinki Chemical Industry, pages 26-32 of "The Newest Chemistry of Coloring Matter-Attractive Application and New Development as a Functional Coloring Matter" (Jun. 19, 1980). Examples of the color formation systems specifically include a color formation system used in pressure-sensitive papers, comprising a color former having a partial structure of lactone, lactam, spiropyran, and an acidic substance (developer), e.g., acid clay, phenol; a system utilizing azo-coupling reaction between an aromatic a diazonium salt, diazotate or diazosulfonate and naphthol, aniline, active methylene; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-l-naphthol.

In the present invention, the color image forming substance preferably is a colored substance showing high stability of the resulting image, such as a dye or a pigment.

The color image forming substance is preferably used in an amount of 0.5 to 100 parts by weight, more preferably 2 to 80 parts by weight, based on 100 parts by weight of the polymerizable compound. In the case that a color developer is used, the amount of the developer is preferably in the range of 0.3 to 80 parts by weight based on one part by weight of the color former.

The color image forming substances is described at pages 35-50 of "Published Technical Information No. 5".

The polymerizable compound used in the present invention is a compound having an ethylenically unsaturated group, namely an ethylenically unsaturated polymerizable compound. The polymerizable compound also preferably has two or more ethylenically unsaturated groups to fix a color image forming substance.

Examples of the ethylenically unsaturated polymerizable compounds include acrylic acids, acrylic salts, acrylic esters, acrylamides, methacrylic acids, methacrylic salts, methacrylic esters, methacrylamides, maleic anhydrides, maleic esters, itaconic esters, styrenes, vinyl ethers, vinyl esters, N-vinyl heterocyclic compounds, allyl ethers and allyl esters. Acrylic esters and methacrylic esters are particularly preferred.

Examples of the acrylic esters include n-butyl acrylate, cyclohexyl acrylate, 2-ethylhexyl acrylate, benzyl acrylate, furfuryl acrylate, ethoxyethoxyethyl acrylate, tricyclodecanyl acrylate, nonylphenyloxyethyl acrylate, 1,3-dioxolan acrylate, hexanediol diacrylate, butanediol diacrylate, neopentylglycol diacrylate, tricyclodecandimethylol diacrylate, trimethylolpropane triacrylate, pentaerythritol tetraacrylate, dipentaerythritol pentaacrylate, dipentaerythritol hexacrylate, diacrylate of polyoxyethylenated bisphenol A, 2-(2-hydroxy-1,1-dimethylethyl)-5-hydroxymethyl-5-ethyl-1,3-dioxane diacrylate, 2-(2-hydroxy-l,l-dimethylethyl)-5,5-dihydroxymethyl -1,3-dioxane triacrylate, triacrylate of propyleneoxide addition product of trimethylolpropane, polyacrylate of hydroxypolyether, polyester acrylate and polyurethane acrylate.

Examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate and dimethacrylate of polyoxyalkylenated bisphenol A.

Two or more polymerizable compounds can be used in combination. In the third and fourth embodiment, the polymerizable compound preferably has a high boiling point (e.g., 80° C. or more).

The ethylenically unsaturated polymerizable compounds, are described in pages 51-55 of "Published Technical Information No. 5" published by Aztech Co., Mar. 22, 1991.

The polymerizable compound is preferably contained in the light-sensitive layer in an amount of 0.5 to 50 g/m$^2$, and more preferably in an amount of 2 to 20 g/m$^2$.

In the first embodiment, a sensitizer is preferably used in addition to the photopolymerization initiator. The sensitizer has a function of increasing the sensitivity of the photopolymerization initiator. Examples of the sensitizers include N-phenylglycine, trimethylbarbituric acid, 2-mercaptobenzoxazole, 2-mercaptobenzthiazole, 2-mercaptobenzimidazole, and the compounds represented by the following formula (I) or (II):

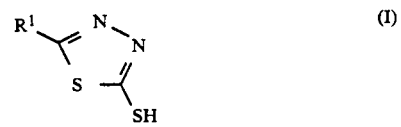

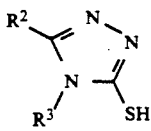

wherein $R^1$ is an alkyl group, an alkylthio group or mercapto; $R^2$ is hydrogen or an alkyl group; and $R^3$ is an alkyl group or an aryl group.

The sensitizer is preferably used in an amount of 0.5 to 100 wt. %, and more preferably in an amount of 2 to 80 wt. % based on the amount of the polymerizable compound.

The components used in the second embodiment are described below. The ethylenically unsaturated polymerizable compound and the color image forming substance used in the second embodiment are the same as those used in the first embodiment.

Examples of the silver halide used in the third and fourth embodiments include silver chloride, silver bromide, silver iodide, silver chlorobromide, silver chloroiodide, silver iodobromide and silver chloroiodobromide in the form of grains.

The silver halide grains may be of various crystal forms, for example, a regular crystal form such as hexahedron, octahedron, dodecahedron or tetradecahedron, an irregular form such as spherical form or tabular form, a form having crystalline defect such as a twinning plane, and a mixed form thereof.

The silver halide grains may be extremely small sized grains having a grain diameter of not more than 0.01 μm, or may be relatively large sized grains having a grain diameter of projected area up to 10 μm. The silver halide emulsion may be a polydispersed emulsion or a monodispersed emulsion. The monodispersed emulsion is described in U.S. Pat. Nos. 3,574,628 and 3,655,394, and U.K. Patent No. 1,413,748.

A tabular grain having an aspect ratio of not less than 5 is also available. The tabular silver halide grains can be prepared by processes described in Gutoff, "Photographic Science and Engineering", Vol. 14, pp. 248-257 (1970), U.S. Pat. Nos. 4,434,226, 4,414,310, 4,433,048 and 4,439,520, and U.K. Patent No. 2,112,157.

Two or more kinds of silver halide grains which differ in halogen composition, crystal habit, grain size, and/or other features from each other can be used in combination. The silver halide grains preferably have a relatively low fogging value.

The silver halide emulsions can be prepared by processes described in "Research Disclosure (RD)", No. 17,643, pp. 22-23 (Dec. 1978), (I. Emulsion preparation and types) and No. 18,716, p. 648; P. Glafkides, Chemie et Phisique Photographique, Paul Montel, 1967; G.F. Duffin, Photographic Emulsion Chemistry (Forcal Press, 1966); and V. L. Zelikman et al., Making and Coating Photographic Emulsion (Forcal Press, 1964).

The silver halide emulsion is generally used after subjecting it to physical ripening, chemical ripening and spectral sensitization. Various additives used in those stages are described in Research Disclosure, No. 17,643 and No. 18,716. The relevant parts in the literature are described below in the form of a table.

Conventional photographic additives used in the invention are also described in the above-mentioned Research Disclosure, and the relevant parts in the literature are also shown in the following table.

| Additives | RD 17,643 | RD 18,716 |
| --- | --- | --- |
| Chemical sensitizing agent | p. 23 | p. 648 (right side) |
| Sensitivity-increasing agent | | p. 648 (right side) |
| Spectral sensitizing agent and Supersensitizing agent | p. 23-24 | p. 648 (right side)-p. 649 (right side) |
| Anti-fogging agent and Stabilizer | p. 24-25 | p. 649 (right side)- |

A water-soluble vinyl polymer may be adsorbed on the silver halide grains.

Details of the silver halide emulsions and the photographic additives are described in pages 2-17 of "Published Technical Information No. 5".

A copolymer of a hydrophilic repeating unit and a hydrophobic repeating unit is preferably dissolved in the polymerizable compound to incorporate silver halide uniformly in light-sensitive microcapsules.

The amount of the silver halide is in the range of 0.1 mg to 10 g in terms of silver (including organic silver salt) based on 1 $m^2$ of the light-sensitive material. The amount of the silver halide only in terms of silver is preferably not more than 1 $g/m^2$, and more preferably in the range of 1 to 500 $mg/m^2$.

The reducing agent used in the second embodiment has a function of reducing the silver halide and/or a function of accelerating (or inhibiting) the polymerization of the polymerizable compound.

Examples of the reducing agents include hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2,4-disulfonamidophenols, 2,4-disulfonamidonaphthols, o- or p-acylaminophenols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones and hydrazines.

The above-mentioned reducing agents are described in pages 18-35 of "Published Technical Information No. 5"; T. James "The theory of the Photographic Process" the fourth edition, pages 291-334 (1977); and Research Disclosure No. 17,029, pages 9-15 (June, 1978) and No. 17643, pages 22-31 (December, 1978).

A reducing agent precursor is also available. The precursor releases a reducing agent when it is heated, or it is contacted with a base. The term "reducing agent" in the present specification includes the reducing agent precursor. Where a reducing agent is basic, it may be used in the form of a salt with an appropriate acid.

Two or more reducing agents can be used in combination. In the case that two or more reducing agents are used, certain interactions between the reducing agent may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound through oxidation-reduction reaction with the other reducing agent. Both interactions may occur simultaneously, so that it is difficult to determine which of the interactions has occurred in practical use.

The reducing agent is preferably used in an amount of 0.1 to 1,500 mole %, and more preferably in the range of 10 to 300 mole %, based on the amount of the silver salt.

In the second embodiment, the polymerizable compound is preferably used in an amount of 5 to 120,000 parts by weight, and more preferably of 10 to 12,000 parts by weigh based on 1 part by weight of the silver halide.

In the second embodiment, a pigment is preferably used as the color image forming substance. The pigment is preferably used in an amount of 5 to 120 wt. %, and more preferably used in an amount of 10 to 60 wt. % based on the amount of the polymerizable compound.

The other optional components used in the second embodiment are described below.

An organic metallic salt can be used as an oxidizing agent in the third and fourth embodiments. An organic silver salt is particularly preferred.

Examples of organic compounds for forming an organic silver salt include benzotriazoles and fatty acids. A silver salt of a carboxylic acid having an alkynyl group such as silver propiolate or an acetylene silver is also available as the organic silver salt. Two or more organic silver salts may be used in combination. The organic silver salt is generally used in an amount of from 0.01 to 10 mole, preferably from 0.01 to 1 mole, per 1 mole of the silver halide.

A radical generator may be contained in the light-sensitive layer. The radical generator accelerates (or inhibits) polymerization of the reducing agent Examples of the radical generators include a triazene silver, a silver diazotate and an azo compound A base or base precursor can be contained in the light-sensitive material. The bases include various inorganic or organic basic compounds. The base precursors are precursors of these bases (including decarboxylation type, thermal decomposition type, reaction type and complex salt-formation type). The base precursor is described in pages 55–86 in "Published Technical Information No. 5".

The base precursor used in the invention preferably releases a base at a temperature in the range of 50° to 200° C., and more preferably in the range of 80° to 180° C.

The base precursor is preferably used in an amount of not more than 100 wt. %, and more preferably 0.1 to 40 wt. % based on the total amount of the light-sensitive layer. Two or more bases or base precursors may be used in combination. The base or base precursor is preferably contained in the light-sensitive microcapsules. The base or base precursor may be arranged outside the light-sensitive microcapsules.

A hot-melt solvent may be contained in the light-sensitive layer. The hot-melt solvent is a solvent of the reducing agent or a compound having a high dielectric constant and a function of accelerating physical development of silver salts. Examples of the hot-melt solvents include polyethylene glycols, derivatives of polyethylene oxides (e.g., oleate ester), bees wax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure, pp. 26–28 (December 1976).

An antioxidant may also be contained in the light-sensitive layer. The antioxidant has a function of eliminating influence of oxygen (which is a polymerization inhibitor). An example of the compounds functioning as an antioxidant is a compound having two or more mercapto groups.

A thermal polymerization initiator may also be used. The thermal polymerization initiator is decomposed under heating to generate a polymerization initiating species, particularly a radical. The thermal polymerization initiator has been known as an initiator of radical polymerization. The thermal polymerization initiators are described in "Addition Polymerization and Ring Opening Polymerization", pp. 6–18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis -(1-cyclohexanecarbonitrile), dimethyl 2,2'-azobisiso-butyrate, 2,2'-azobis(2-methylbutyronitrile), and azobisdimethylvaleronitrile; organic peroxides, e.g., benzoyl peroxide, di-tert-butyl peroxide, dicumyl peroxide, tertbutyl hydroperoxide, and cumene hydroperoxide; inorganic peroxides, e.g., hydrogen peroxide, potassium persulfate, and ammonium persulfate; and sodium p-toluenesulfinate. The thermal polymerization initiator is preferably used in an amount of from 0.1 to 120 wt. %, and more preferably from 1 to 10 wt. % based on the amount of the polymerizable compound. In a system in which the polymerizable compound within the area where the latent image has not been formed is polymerized, a thermal polymerization initiator is preferably contained in the light-sensitive layer.

In a system in which the polymerizable compound within the area where the latent image has not been formed is polymerized, a photopolymerization initiator may be used in place of the thermal polymerization initiator.

The light-sensitive layer may further contain a compound which releases water.

Microcapsules used in the first and second embodiments are described below.

There is no specific limitation on preparation of the light-sensitive microcapsules. Processes for preparation of the light-sensitive microcapsules are described in pages 88–89 of "Published Technical Information No. 5".

Examples of the processes for preparing microcapsules (encapsulation processes) include a process using coacervation of a hydrophilic shell material as described in U.S. Pat. Nos. 2,800,457 and 2,800,458; an interface polymernation process as described in U.S. Pat. No. 3,287,154, British Patent No. 990,443, and Japanese Patent Publication Nos. 38(1963)-19574, 42(1967)-446 and 42(1967)-771; a polymer deposition process as described in U.S. Pat. Nos. 3,418,250 and 3,660,304; a process using an isocyanatepolyol shell material as described in U.S. Pat. No. 3,796,669; a process using an isocyanate shell material as described in U.S. Pat. No. 3,914,511; a process using a urea-formaldehyde or urea-formaldehyde-resorcinol shell material as described in U.S. Pat. Nos. 4,001,140, 4,087,376 and 4,089,802; a process using a shell material such as melamine-formaldehyde resin or hydroxypropyl cellulose as described in U.S. Pat. No. 4,025,455; an in-situ process using polymerization of monomers as described in Japanese Patent Publication No. 36(1961)-9168 and Japanese Patent Provisional Publication No. 51(1976)-9079; a polymerization-dispersion cooling process as described in U.K. Patent Nos. 927,807 and 965,074; and a spray-drying process as described in U.S. Pat. No. 3,111,407 and U.K. Patent No. 930,422.

In the second embodiment, silver halide is preferably contained in the shell of the microcapsules. The shell of the microcapsules is preferably made by forming a film by a reaction of a water-soluble polymer having a sulfinyl group with an ethylenically unsaturated polymerizable compound and forming a resin shell of a polymeric compound (e.g., a melamine-formaldehyde resin) around the film.

The average particle size of the light-sensitive microcapsules is preferably in the range of 1 to 50 μm, and more preferably in the range of 3 to 25 μm.

The other optional components used in the invention are described below. The optional components include polymerization inhibitors, oxygen scavengers, oils, surface active agents, fluorescent brightening agents, discoloration inhibitors, antihalation dyes or pigments, antiirradiation dyes or pigments, dyes decolored by irradiation with light, matting agents, antismudging agents, plasticizers, binders and solvents of the polymerizable compound.

Examples of the polymerization inhibitors include p-methoxyphenol, hydroquinone, alkyl or aryl-substituted hydroquinone, t-butylcatechol, naphthylamine, β-naphthol, nitrobenzene, dinitrobenzene and p-toluidine. The polymerization inhibitor is preferably used in an amount of 0.001 to 10 wt. %, and more preferably of 0.01 to 1 wt. % based on the amount of the polymerizable compound.

Examples of the oxygen scavengers include an organic phosphine, an organic phosphonate, an organic phosphite and a primary tin salt. The oxygen scavenger is preferably used in an amount of 1 to 50 wt. %.

Examples of the oils include high-boiling organic solvents which are used as solvents for emulsifying and dispersing hydrophobic compounds.

The surface active agent is used for various purposes, such as aiding the coating process, increasing facility of releasing, increasing slipperiness, preventing electrostatic-charging and accelerating development. Examples of the surface active agents include pyridinium salts, ammonium salts, phosphonium salts and polyalkylene oxides.

Anti-halation or anti-irradiation dyes or pigments such as white pigments can be added to the light-sensitive layer of the light-sensitive material.

The light-sensitive microcapsules may contain dyes having properties of being decolorized when it is heated or irradiated with light. The dyes having such properties can be used in the light-sensitive material as a yellow filter layer in a conventional silver salt photographic system.

The antismudging agents preferably are particles which are solid at ambient temperatures. Examples of the anti-smudging agents include starch particles described in U.K. Patent No. 1,232,347; polymer particles described in U.S. Pat. No. 3,625,736; microcapsule particles containing no color former described in U.K. Patent No. 1,235,991; and cellulose particles, and inorganic particles, such as particles of talc, kaolin, bentonite, agaimatolite, zinc oxide, titanium dioxide or aluminum oxide described in U.S. Pat. No. 2,711,375. Such particles preferably have a mean size of 3 to 50 μm, and more preferably 5 to 40 μm. The size of the particles is preferably larger than that of the microcapsule. The size of the particles is preferably larger than that of the light-sensitive microcapsules.

The binders can be contained in the light-sensitive layer singly or in combination. The binder preferably is a hydrophilic binder, and representative hydrophilic binders are transparent or semi-transparent binders. Examples of the binders include natural substances such as gelatin, gelatin derivatives, cellulose derivatives, starch and gum arabic, and synthetic polymeric substances such as water-soluble polyvinyl compounds (e.g., polyvinyl alcohol, polyvinylpyrrolidone and acrylamide polymers). Other synthetic polymeric substances such as vinyl compounds dispersed in the form of latex, which are particularly effective to increase dimensional stability of photographic materials are also available. The binder is preferably employed in an amount of 2 to 100 wt. % based on the amount of the polymerizable compound In the case of using a solvent for the polymerizable compound, the solvent is preferably contained in microcapsules which are different from the light-sensitive microcapsules containing the polymerizable compound.

The light-sensitive may further contain a hardening agent. Examples of the hardening agents include aldehydes, epoxy compounds, vinylsulfone compounds, N-methylol compounds and polymeric hardening agents. The hardening agent is preferably used in an amount of 0.1 to 30 wt. %, and more preferably 0.5 to 10 wt. % based on the amount of the binder.

The light-sensitive layer preferably has a pH value of not higher than 7.

The light-sensitive material can be prepared by arranging a light-sensitive layer containing the above-mentioned components on a support. There is no specific limitation with respect to the support. In the case that a heat development is employed, a material for the support preferably is resistant to heat given in the developing stage. Examples of the materials for the preparation of the supports include glass, paper, fine paper, coat paper, cast-coat paper, synthetic paper, metals and analogues thereof, films of polyester, acetyl cellulose, cellulose ester, polyvinyl acetal, polystyrene, polycarbonate and polyethylene terephthalate, and paper laminated with resin or polymer (e.g., polyethylene).

In the case that a porous material such as paper is employed as the support, the porous support preferably has a certain smoothness. A paper support preferably has a low water absorption, a certain Bekk Smoothness, a low shrinkage ratio, a low air permeation rate or a pH value of 5 to 9.

Next, the image forming steps are described below.

various exposure means can be employed in the imagewise exposure, and generally the light-sensitive material is imagewise exposed to a radiation containing visible light to obtain a latent image of the silver halide. The kind of light source or the amount of radiation used in the exposure can be selected depending on a light-sensitive wavelength of the silver halide (or intensified wavelength in the case of spectral sensitization) or the photopolymerization initiator.

Examples of the light source, with respect to a light source of a low energy radiation, include natural light, ultraviolet rays, visible light, infrared rays, a fluorescent lamp, a tungsten lamp, a mercury lamp, a halogen lamp, a xenon flash lamp, various lasers (e.g., a gas laser, a solid laser, a chemical laser and a semiconductor laser), a light emission diode, a plasma emitting tube and FOT.

High energy radiation such as X-ray, y-ray and electron beam is also available in special cases.

In the case where a full color image is formed, the light-sensitive material contains two or more microcapsules which are different from each other with respect to the spectral sensitivity. Therefore, the light-sensitive material is required to be exposed to two or more spectral lights to form a full color image. Accordingly, the light sources may be used singly or in combination.

The light source should be selected in consideration of the light-sensitive wavelength as is mentioned above. Further, it is preferably considered whether the image information is converted into an electrical signal or not (digital or analog). The processing speed of the system, the sizes of the image recording apparatus and the electric power of the apparatus are also important factors in the selection of the light source.

In the case where the image information is not converted into an electrical signal (for example, a case where a subject such as a landscape and a portrait is directly photographed, a case where an original image is directly copied, or a case where a positive film such as a reversal film is exposed to light), exposure devices for a camera, a printer, an enlarging apparatus and a copying machine are available. Using these exposure devices, a two-dimensional image can be exposed to light by one shot. Further, the image can also be scanned through a slit. Moreover, an original image can be enlarged or reduced. In this case, a preferred light source is not a monochromatic light such as a laser but a fluorescent lamp, a tungsten lamp or a combination of plural monochromatic lights.

In the case where the image information is an electrical signal, two or more monochromatic lights such as a light emission diode or a laser can be used in combination as a light source. The combination is determined in consideration of the spectral sensitivity of the heat-developing color light-sensitive material. Further, various known display devices (CRT, liquid crystal display, electroluminescence display, electrochromic display and plasma display) are also available. In this case, the image information is an image signal such as a signal obtained by a video camera or an electron still camera, a television signal (e.g., a signal regulated by Japan Television Signal Standards (NTSC)), a signal consisting of many image elements obtained by scanning an original image, and a signal stored in a recording material such as a magnetic tape or disk.

In the case of the exposure of a color image, two or more monochromatic lights are used in combination in consideration of the spectral sensitivity of the light-sensitive material. In this case, two or more light sources such as LED, a laser and a fluorescent lamp may be used in combination. The light sources may be the same or different. The spectral sensitivity of the light-sensitive material usually contains R (Red), G (Green) and B (Blue). Light sources of UV (Ultraviolet) and IR (Infrared) have also recently been available. In addition to the combination of R, G and B, examples of the combination of the spectral sensitivity include (G, R, IR), (R, short wave IR, long wave IR), (short wave UV, medium wave UV, long wave UV) and (UV, B, G). A combination of different light sources such as two kinds of LED and a laser is available. A light emitting tube or element can be used in a scanning exposure with respect to individual colors. Arrays such as a LED array, a liquid crystal shutter array and a magneto-optical element shutter array can be used to increase the speed of the exposure.

The above-mentioned display devices include a monochromatic device such as CRT and a color device. If a multiple exposure is carried out using some filters, even a monochromatic device can form a color image. Such system is also available. A conventional two-dimensional display device can be used as a one-dimensional device such as FOT. In the case where the display device and a scanner are used in combination, the displayed image can be divided into two or more parts.

In the first embodiment, the polymerizable compound is hardened by the above-mentioned imagewise exposure process. In the second embodiment, a latent image of silver halide in the microcapsules is formed by the exposure.

In the second embodiment, the light-sensitive material is developed to harden the polymerizable compound. The development is preferably conducted by heating the light-sensitive material.

The light-sensitive material is preferably heated from the side of the support on which the light-sensitive layer is not provided.

Heating in the heat development process can be conducted in various known manners. For example, a heating layer which is arranged on the light-sensitive material can be used as the heating means. Further, the light-sensitive material can be heated on a hot plate, an iron or a heat roller. Furthermore, the material can be heated between a heat roller and a belt.

The whole surface of the light-sensitive material may be heated by a heater which is larger than the light-sensitive material. The light-sensitive material may also be heated by scanning the material with a small heater (e.g., hot plate, heat roller, heat drum).

Further, the light-sensitive material can be heated without directly contacting the material with a heater. For example, the light-sensitive material may be heated by application of an electromagnetic wave, infrared rays or a hot air.

The light-sensitive material is preferably heated from the side of the support (the side on which the light-sensitive layer is not provided). The side of the light-sensitive layer is usually open to the air. However, the side of the layer may be covered with an adiabatic material to maintain the heating temperature. In this case, it is necessary to handle carefully the adiabatic material. If the adiabatic material is pressed on the light-sensitive material at a high pressure (10 kg/cm$^2$ or more), the microcapsules contained in the light-sensitive layer tend to be ruptured.

Heat development of the light-sensitive material is conducted simultaneously or after the imagewise exposure, but the heat development is preferably carried out at an interval of 0.1 second or more.

The heating temperature usually ranges from 60° C. to 250° C., preferably from 80° C. to 180° C. The heating time is in the range of 0.1 to 20 seconds, preferably 0.1 to 5 seconds.

The light-sensitive material may be heated while a liquid such as water prevents influence of oxygen in the air.

In the second embodiment, the light-sensitive material is subjected to the heat development as described above to polymerize the polymerizable compound within the area where a latent image of the silver halide is formed or the area where a latent image of the silver halide is not formed. If a polymerization inhibitor is produced by the reaction with the reducing agent within the area where a latent image of the silver halide is formed, the thermal polymerization initiator or the photopolymerization initiator contained in the microcapsules of the light-sensitive layer may be heated or irradiated with a light to be decomposed, so as to uniformly produce radicals, whereby the polymerizable compound within the area where a latent image of the silver halide is not formed can be polymerized. In this case, heating or exposing the whole surface of the light-sensitive material is necessary in addition to the heat developing process, and a process therefor is similar to that of the imagewise exposure or that of the heat developing process.

A color image can be obtained on an image receiving material by pressing the light-sensitive material on the image receiving material to transfer a color image forming substance with the unpolymerized polymerizable compound to the image receiving material.

For applying a pressure to the light-sensitive material and the image receiving material, any known pressing methods can be employed.

For example, the light-sensitive material and the image receiving material may be sandwiched between press plates such as a presser or they may be transferred using a pressure roller such as nip rolls to apply a pressure to them. A dot-impact device can be also employed to give intermittently a pressure to them.

Otherwise, a pressure may be applied to the light-sensitive material and the image receiving material by spraying a high-pressure air by means of an air gun or using an ultrasonic wave-generating device or a piezoelectric element.

The light-sensitive material and the image receiving material are preferably pressed at a pressure of not less than 500 kg/cm$^2$, preferably not less than 800 kg/cm$^2$. However, if those materials are heated at a temperature of 40° to 120° C. in the pressing procedure, a pressure of less than 300 kg/cm$^2$ is enough.

The image receiving material of the present invention contains particles of a thermoplastic compound. After a color image is transferred to the image receiving material, the image receiving material may be heated (optionally under pressure) to melt the thermoplastic compound. Thus a glossy image can be formed on the image receiving material.

The image receiving material may be heated or pressed according to a conventional way.

For example, the image receiving material may be directly heated on a hot plate or drum. The material may be conveyed and heated on a heated roller. The material may also be placed on a heated film.

The image receiving material is peeled from the heating means such as a hot plate or a heated film preferably after the material is cooled to a temperature of lower than the glasstransition point of the thermoplastic compound.

The image receiving material may be indirectly heated in a hot air. The material may also be indirectly heated with high frequencies or a laser beam. Further, the material may be heated by an infrared heater. Furthermore, the material may be heated with eddy current formed by electromagnetic induction.

The image receiving material may be placed in a hot bath containing an inert liquid such as a liquid of fluoride to heat the material.

An heating means may be attached to the image receiving material. For example, a layer containing conductive particles such as carbon black or graphite may be provided on the image receiving material. The material is heated with the conductive particles by Joule heat formed by current conducting.

EXAMPLE 1

Preparation of Image Receiving Material (D)

To 100 g of 10% aqueous solution of polyvinyl alcohol (PVA 205, Kuraray Co., Ltd.) were added 50 g of poly-α-amethylstyrene powder (Crystalex 1120, Rika Hacules Co., Ltd.) and 200 ml of glass beads having a particle size in the range of 0.5 to 0.75 om. The mixture was stirred at 3,000 rpm for 30 minutes using Dynomill to obtain a dispersion of poly-a-methylstyrene particles.

To 81.5 g of the dispersion were added 29.2 g of 14% aqueous solution of lime-treated gelatin, 4.5 g of 3% aqueous solution of sodium polyvinylbenzene sulfonate and 3.4 g of water. The mixture was stirred at 40° C. to prepare a coating solution of the image receiving layer.

The coating solution was coated on a paper support having basis weight of 80 g/m$^2$ in coating amount of 96 ml/m$^2$ according to an extrusion method. The paper support has fiber length distribution [defined by JIS-P-8207] in which the sum of wt. % of 24 mesh residue and 42 mesh residue is within a range of 30 to 60%, as is described in U.S. Pat. No. 4,871,643. The image receiving layer was dried at 55° C. to prepare an image receiving material (D).

The image receiving material (D) was further heated at 110° C. for 15 minutes in a forced convection dryer to prepare an image receiving material (A) of the present invention.

Preparation of Silver Halide Emulsion (EB-1)

In distilled water was dissolved 24 g of lime-treated inert gelatin at 40° C. over 1 hour. To the resulting solution was added 3 g of NaCl, and then the pH value of the solution was adjusted to 3.2 using 1N-sulfuric acid.

To the obtained gelatin solution, 10 mg of the following compound (AGS-1) was added, and then the following Liquids (I) and (II) were further added simultaneously at the same feed rate at the constant pAg value of 8.5 at 60° C. over 45 minutes according to a control double jet method. After the addition was complete, the pH value was adjusted to 6.0 using 1N NAOH, and then 6.4 mg of the following compound (AZ-1) and 4.8 mg of the following compound (AZ-2) were added to ripen the mixture at 60° C. for 60 minutes. After the ripening was complete, to the resulting mixture were added 4.8 mg of the following compound (AZ-3) and 480 mg of the following compound (SB-1). After 20 minutes, to the mixture was further added 100 g of an aqueous solution containing 4.1 g of KI at the same feed rate over 3 minutes.

To the resulting emulsion was then added 1.1 g of the following compound (CK-1) to form sediment. After the emulsion was washed with water for desalting, 6 g of lime-treated gelatin was added and dissolved. Then, to the emulsion was further added 3 ml of 72% aqueous solution of the following compound (ATR-1) to adjust the pH value to 6.2. Thus, a monodispersed tetradecahedral silver iodobromide emulsion (EB-1) was prepared. The yield was 550 g, the mean grain size was 0.24 μm, and the distribution coefficient was 20%.

| | | |
|---|---|---|
| Liquid (I): | AgNO₃ | 120 g |
| | distilled water | 550 ml |
| Liquid (II): | KBr | 85 g |
| | distilled water | 550 ml |

Preparation of Silver Halide Emulsion (EG-1)

The procedure of the preparation of silver halide emulsion (EB-1) was repeated except that Liquids (I) and (II) were added over 15 minutes and that 450 mg of the following compound (SG-1) was used instead of the compound (SB-1).

Thus, a monodispersed silver iodobromide emulsion (EG-1) was prepared. The yield was 550 g, the mean grain size was 0.18 μm, and the distribution coefficient was 20%.

Preparation of Silver Halide Emulsion (ER-1)

The procedure of the preparation of silver halide emulsion (EB-1) was repeated except that Liquids (I) and (II) were added over 15 minutes and that 450 mg of the following compound (SR-1) and 100 mg of the following compound (SR-2) were added instead of the compound (SB-1).

Thus, a monodispersed silver iodobromide emulsion (ER-1) was prepared. The yield was 550 g, the mean grain size was 0.18 μm, and the distribution coefficient was 22%.

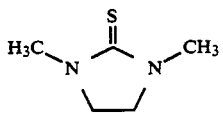

(AGS-1)

Na₂S₂O₃·5H₂O  (AZ-1)

HAuCl₄·4H₂O  (AZ-2)

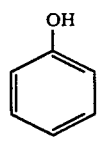

(ATR-1)

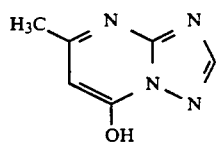

(AZ-2)

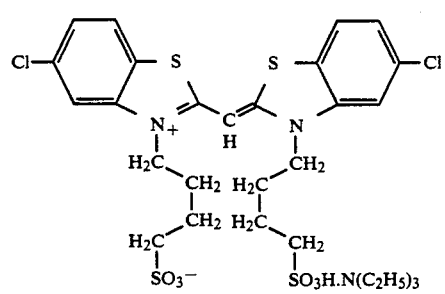

(SB-1)

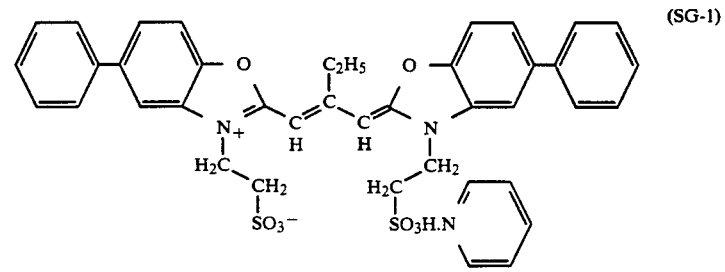

(SG-1)

(SR-1)

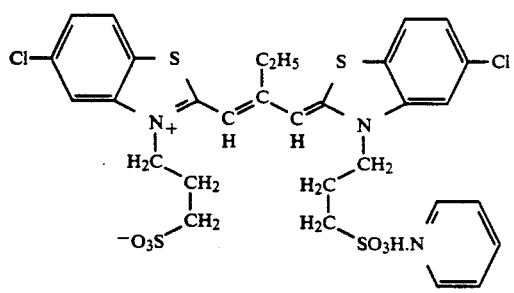

(SR-2)

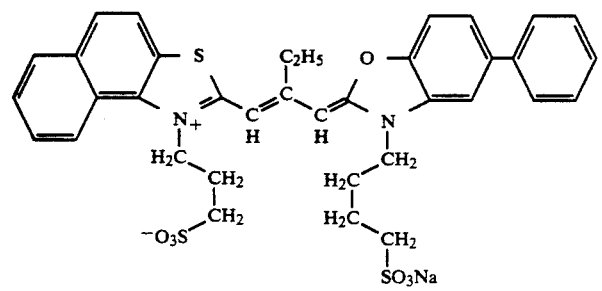

Poly(isobutylene-co-monosodium maleate)

Preparation of Solid Dispersion (KB-1)

Into a 300 ml dispersion container were introduced 110 g of 5.4% aqueous solution of lime-treated gelatin, 20 g of 5% aqueous solution of polyethylene glycol (average molecular weight: 2,000), 70 g of a base precursor (BG-1) and 200 ml of glass beads having a diameter of 0.5 to 0.75 mm. The resulting mixture was stirred at 3,000 rpm for 30 minutes using a Dynomill, and then the pH value was adjusted to 6.5 using 2N sulfuric acid, to obtain a solid dispersion (KB-1) of a base precursor (BG-1) having a grain size of not more than 1.0 μm.

(BG-1)

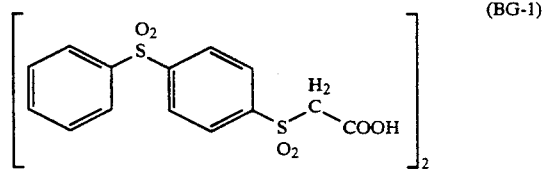

(CK-1)

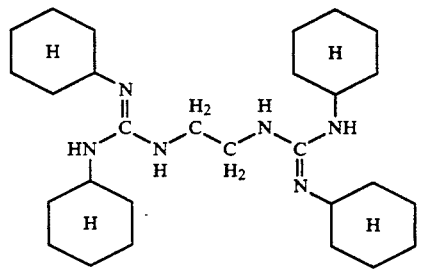

Preparation of Pigment Dispersion (GY-1)

To 255 g of a polymerizable compound (MN-1) was added 45 g of Chromo Fine Yellow 5900 (tradename, Dainichi Seika K.K.) The resulting mixture was stirred at 5,000 rpm for 1 hour using Eiger Motor Mill (tradename, Eiger Engineering) to obtain a pigment dispersion (GY-1).

Polymerizable compound (MN-1)

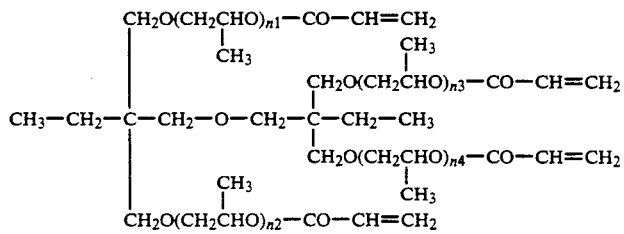

($n1 + n2 + n3 + n4 = 2$, available from Nippon Kayaku Co., Ltd.)

Preparation of Pigment Dispersion (GM-1)

To 270 g of the polymerizable compound (MN-1) were added 30 g of Rubin F6B (tradename, Hechist) and 15 g of Disperbik-161 (tradename, BYK Chemie).

The resulting mixture was stirred at 5,000 rpm using Eiger Motor Mill (tradename, Eiger Engineering) for 1 hour to obtain a pigment dispersion (GM-1).

Preparation of Pigment Dispersion (GC-1)

In 255 g of the polymerizable compound (MN-1) was added 45 g of copper phthalocyanine (C.I. Pigment 15) and and 15 g of Disperbik-161 (tradename, BYK Chemie). The resulting mixture was stirred at 5,000 rpm using Eiger Motor Mill (tradename, produced by Eiger Engineering) for 1 hour to obtain a pigment dispersion (GC-1).

Preparation of Light-Sensitive Composition (PB-I)

In 45 g of the pigment dispersion (GY-1) were dissolved 9 g of a 10 wt. % solution of (IP-4) in (SV-1), 2.3 g of (RD-1), 3.1 g of (RD-3), 2 g of a 0.5 wt. % solution of (FF-3) in (SV-1) and 0.5 g of (ST-1), to prepare an oily solution.

To the resulting oily solution, 7.6 g of the silver halide emulsion (EB-1) and 24 g of the solid dispersion (KB-1) were added, and the resulting mixture was stirred at 10,000 rpm for 5 minutes at 60° C. using a dissolver of 40 φ to obtain a light-sensitive composition (PB-1) in the form of a W/O emulsion.

Preparation of Light-Sensitive Composition (PG-1)

In 45 g of the pigment dispersion (GM-1) were dissolved 9 g of a 10 wt. % solution of (1P-4) in (SV-1), 2.3 g of (RD-1), 3.1 g of (RD-3), 2 g of a 0.5 wt. % solution of (FF-3) in (SV-1) and 0.5 g of (ST-2), to prepare an oily solution.

To the resulting oily solution, 7.6 g of the silver halide emulsion (EG-1) and 24 g of the solid dispersion (KB-1) were added, and the resulting mixture was stirred at 10,000 rpm for 5 minutes at 60° C. using a dissolver of 40 φ to obtain a light-sensitive composition (PG-1) in the form of a W/O emulsion.

Preparation of Light-Sensitive Composition (PR-1)

In 45 g of the pigment dispersion (GC-1) were dissolved 9 g of a 10 wt. % solution of (lP-4) in (SV-I), 2.3 g of (RD-1), 3.1 g of (RD-2), 2 g of a 0.5 wt. % solution of (FF-3) in (SV-1) and 0.5 g of (ST-1), to prepare an oily solution.

To the resulting oily solution, 7.6 g of the silver halide emulsion (ER-1) and 24 g of the solid dispersion (KB-1) were added, and the resulting mixture was stirred at 10,000 rpm for 5 minutes at 50° C. using a dissolver of 40 φ to obtain a light-sensitive composition (PR-1) in the form of a W/O emulsion.

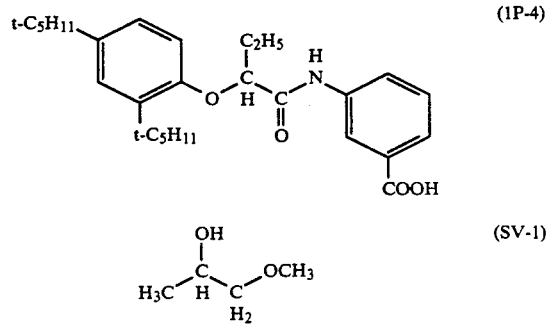

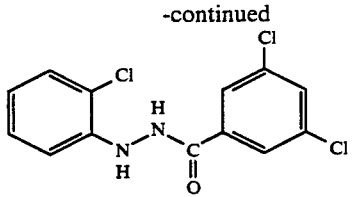
(RD-1)

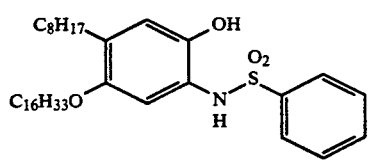
(RD-2)

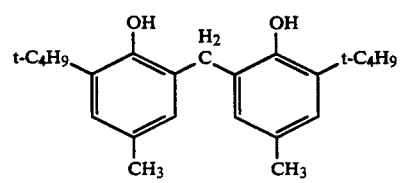
(RD-3)

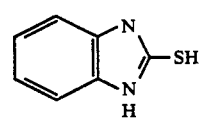
(FF-3)

$CH_3(CH_2)_{16}OH$ (ST-1)

Polyethylene glycol (ST-2)
(average molecular weight: 20,000)

Preparation of Light-Sensitive Microcapsule (CB-1)

To 2 g of 14% aqueous solution of the following polymer (2P-5) was added 38 g of water, and then the pH value the resulting mixture was adjusted to 5.0 using 2N sulfuric acid. To the mixture was added 60 g of 10% aqueous solution of the following polymer (2P-2), and the obtained mixture was stirred at 60° C. for 30 minutes. Then the above-obtained light-sensitive composition (PB-I) was added to the mixture, and the resulting mixture was stirred at 6,000 rpm for 20 minutes at 60° C. using a dissolver of 40 φ to obtain a W/O/W emulsion.

Independently, to 31.5 g of melamine were added 52.2 g of a 37% aqueous solution of formaldehyde and 170.3 g of water, and the resulting mixture was stirred at 60° C. for 30 minutes to obtain a transparent melamine-formaldehyde precondensate.

To the above-prepared W/O/W emulsion was added 25 g of the above-obtained precondensate having been cooled to 40° C. While the resulting mixture was stirred at 1,200 rpm using a propeller mixer, the pH value was adjusted to 5.0 using 2N sulfuric acid. The mixture was then gradually heated to 70° C. over 30 minutes, and then stirred for 30 minutes. Further, to the mixture was added 10.3 g of 40% aqueous solution of urea, and the mixture was adjusted to pH 3.5 using 2N sulfuric acid and then stirred at 70° C. for 40 minutes. After the mixture was cooled to 40° C., 9 g of 3% aqueous solution of K-carrageenan was added to the mixture. The resulting mixture was stirred for 10 minutes and adjusted to pH 6.5 using 2N aqueous solution of sodium hydroxide. Thus, a light-sensitive microcapsule dispersion (CB-1) was prepared.

Polymer (2P-5)

Potassium polyvinylbenzenesulfinate-sodium polyacrylamidomethanesulfonate copolymer Polymer (2P-2)

Polyvinyl pyrrolidone (K-90)

Preparation of Light-Sensitive Microcapsule (CG-1)

The procedure of the preparation of (CB-1) was repeated except for using (PG-1) instead of (PB-1), to prepare a light-sensitive microcapsule dispersion (CG-I).

Preparation of Light-Sensitive Microcapsule (CR-1)

The procedure of the preparation of (CB-1) was repeated except for using (PR-1) instead of (PB-1), to prepare a light-sensitive microcapsule dispersion (CR-1).

Preparation of Polymerizable Compound Microcalpsule (HB-1)

In 243 g of the polymerizable compound (MN-1) was dissolved 16 g of isocyanate (Takenate D 110N, Takeda Chemical Industries). The solution was added to 259 g of 3% aqueous solution of Metrose 65 SH 50 (Shinetsu Chemical Industry Co., Ltd.). The mixture was stirred at 1,600 rpm for 20 minutes using a dissolver of 40 $\phi$ to prepare an O/W emulsion. To the emulsion was further added 30 g of 2% aqueous solution of diethylenetriamine (Kanto Chemical Industry Co., Ltd.). The mixture was reacted at 40° C. for 90 minutes. The resulting mixture was adjusted to pH of 6 to prepare a dispersion of polymerizable compound microcapsule (HB-1).

Preparation of Light-Sensitive Material 101

Each of 15 g of the light-sensitive microcapsule dispersion (CB-1), 15 g of the light-sensitive microcapsule dispersion (CG-1) and 15 g of the light-sensitive microcapsule dispersion (CR-1) was heated to 40° C. without stirring, and then they were mixed with each other. To the resulting mixture were added 6.5 g of 5% aqueous solution of the following surface active agent (ww-1), 8 g of 1% aqueous solution of the following surface active agent (WW-2), 16 g of the polymer (PC-3) and 14 g of the dispersion of polymerizable compound (HB-1), and the resulting mixture was stirred at 40° C. for 10 minutes. The mixture was filtered over a filter of 44 μm in mesh, to prepare a capsule coating solution 101.

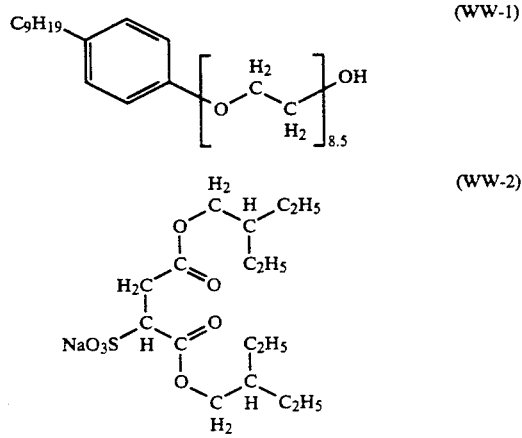

An aluminum-deposited surface of a support consisting of a polyethylene terephthalate film (thickness: 25 μm) and a layer of aluminum deposited thereon was coated with the above-obtained coating solution in an amount of 100 ml/m² by an extrusion method, and the coated layer of the solution was dried at 60° C. The dried film was rolled up under the conditions of 25° C. and 65% (relative humidity) so that the coated surface might be inside. Thus a light-sensitive material (101) was prepared.

Image Formation

The light-sensitive material (101) was exposed to light at 5,000 lux for 1 second using a halogen lamp kept at a color temperature of 3,100° K. through a step wedge filter in which a transmission density of a silver image of black color is changed continuously from 0 to 4.0. Immediately after the exposure, the support side surface of the light-sensitive material (i.e., the side surface where the light-sensitive layer was not provided) was brought into close contact with a drum heated at 150° C. to perform heat development of the light-sensitive material for 1.0 second.

After 30 seconds, the light-sensitive material was superposed on the image receiving material (A) so that the coated layers of both materials might be in close contact with each other, and they were passed through press rollers (diameter: 3 cm, surface temperature: 70° C.) having a pressure of 220 kg/cm² at a rate of 2 cm/sec, and immediately the light-sensitive material was removed from the image receiving material (A).

The maximum and minimum densities of the obtained image were measured using a reversal X-light. The results are set forth in Table 1.

EXAMPLE 2

Preparation of Image Receiving Material (B)

In 15 g of 10% aqueous solution of the surface active agents (WW-1) were dispersed 5 g of dispersion of crosslinked polystyrene porous particles (SBP-3, Sekisui Chemical Co., Ltd.) to prepare a dispersion of porous particles. To 65.2 g of the dispersion of the poly-α-methylstyrene powder used in Example 1 were added 20.4 g of the dispersion of the porous particles, 29.2 g of 14% aqueous solution of lime-treated gelatin, 4.5 g of 3% aqueous solution of sodium polyvinylbenzene sulfonate and 3.4 g of water. The mixture was stirred at 40° C. to prepare a coating solution of the image receiving layer.

The coating solution was coated on a paper support having basis weight of 80 g/m² in coating amount of 96 ml/m² according to an extrusion method. The paper support has fiber length distribution [defined by JIS-P-82071 in which the sum of wt. % of 24 mesh residue and 42 mesh residue is within a range of 30 to 60%, as is described in U.S. Pat. No. 4,871,643. The image receiving layer was dried at 55° C. to prepare an image receiving material (E)

The image receiving material (E) was further heated at 110° C. for 15 minutes in a forced convection dryer to prepare an image receiving material (B) of the present invention.

Image Formation

An image was formed in the same manner as in Example 1, except that the image receiving material (B) was used. The maximum and minimum densities of the obtained image were measured using a reversal X-light. The results are set forth in Table 1.

EXAMPLE 3

Preparation of Image Receiving Material (C)

An image receiving material (F) was prepared in the same manner as in preparation of the image receiving material (D), except that poly-α-methylstyrene powder (Crystalex 3100, Rika Hacules Co., Ltd.) was used in place of Crystalex 1120.

The image receiving material (F) was further heated at 80° C. for 30 minutes in a forced convection dryer to prepare an image receiving material (C) of the present invention.

Image Formation

An image was formed in the same manner as in Example 1, except that the image receiving material (C) was used. The maximum and minimum densities of the obtained image were measured using a reversal X-light. The results are set forth in Table 1.

COMPARISON EXAMPLE 1

Image Formation

An image was formed in the same manner as in Example 1, except that the image receiving material (D) prepared in Example 1 was used. The maximum and minimum densities of the obtained image were measured using a reversal X-light. The results are set forth in Table 1.

COMPARISON EXAMPLE 2

Image Formation

An image was formed in the same manner as in Example 1, except that the image receiving material (E) prepared in Example 2 was used. The maximum and minimum densities of the obtained image were measured using a reversal X-light. The results are set forth in Table 1.

COMPARISON EXAMPLE 3

Image Formation

An image was formed in the same manner as in Example 1, except that the image receiving material (F) prepared in Example 3 was used. The maximum and minimum densities of the obtained image were measured using a reversal X-light. The results are set forth in Table 1.

COMPARISON EXAMPLE 4

The image receiving material (D) was further heated at 50° C. for 30 minutes in a forced convection dryer to prepare an image receiving material (G).

Image Formation

An image was formed in the same manner as in Example 1, except that the image receiving material (G) was used. The maximum and minimum densities of the obtained image were measured using a reversal X-light. The results are set forth in Table 1.

Evaluation of Porous Surface of Image Receiving Layer

With respect to each of the image receiving materials (A) to (G), the porous surface of the image receiving layer was observed using a scanning electron microscope. The diameter of the opens of the pores was measured. The results are set forth in Table 1.

TABLE 1

| No. | Example | | | Comparison Example | | | |
|---|---|---|---|---|---|---|---|
| | 1 | 2 | 3 | 1 | 2 | 3 | 4 |
| Image receiving Material | A | B | C | D | E | F | G |
| Softening point of thermoplastic particles (°C.) | 53 | 53 | 48 | 53 | 53 | 48 | 53 |
| Porous particles | — | + | — | — | + | — | — |
| Heating temperature (°C.) | 110 | 110 | 80 | — | — | — | 50 |
| Heating time (minutes) | 15 | 15 | 30 | — | — | — | 30 |
| Maximum Density | 0.98 | 1.35 | 1.10 | 0.55 | 0.68 | 0.60 | 0.60 |
| Minimum Density | 0.07 | 0.08 | 0.07 | 0.05 | 0.06 | 0.05 | 0.06 |
| Average diameter of open of the pores (μm) | 5 | 8 | 5 | 1 | 1 | 1 | 1 |

As is evident from Table 1, the image receiving materials of the present invention have porous surfaces with wide pores. The image receiving materials of the invention form a clear image having a high maximum density. The effect of the invention is improved where porous particles are added to the image receiving layer as is shown in Example 2.

I claim:

1. An image receiving material which comprises an image receiving layer provided on a support, said image receiving layer containing particles of a thermoplastic compound, and said layer having a porous surface formed by the particles, wherein the image receiving material is prepared by forming the image receiving layer on the support and heating the image receiving layer at a temperature of higher than a softening point of the thermoplastic compound to widen pores in the porous surface.

2. The image receiving material as claimed in claim 1, wherein the image receiving layer is formed by coating a dispersion of the particles of the thermoplastic compound on the support, and drying the image receiving layer at a temperature of lower than the softening point of the thermoplastic compound.

3. The image receiving material as claimed in claim 1, wherein the image receiving layer is heated at a temperature of at least 10° C. higher than the softening point of the thermoplastic compound.

4. The image receiving material as claimed in claim 1, wherein the image receiving layer is heated at a temperature of at least 20° C. higher than the softening point of the thermoplastic compound.

5. The image receiving material as claimed in claim 1, wherein the image receiving layer is heated at a relative humidity of not more than 70%.

6. The image receiving material as claimed in claim 1, wherein the image receiving layer is heated for not shorter than 30 seconds.

7. The image receiving material as claimed in claim 1, wherein the thermoplastic compound has a softening point in the range of 30 to 200° C.

8. The image receiving material as claimed in claim 1, wherein the particles of the thermoplastic compound have an average particle size in the range of 0.01 to 100 μm.

9. The image receiving material as claimed in claim 1, wherein the image receiving layer contains the thermoplastic compound in an amount of 0.1 to 60 g/m².

10. The image receiving material as claimed in claim 1, wherein the image receiving layer further contains a binder.

11. The image receiving material as claimed in claim 1, wherein the image receiving layer further contains a white pigment.

12. The image receiving material as claimed in claim 1, wherein the image receiving layer further contains porous particles.

13. The image receiving material as claimed in claim 12, wherein the porous particles have an average diameter in the range of 0.1 to 100 μm.

14. The image receiving material as claimed in claim 12, wherein the image receiving layer contains the porous particles in an amount of 0.1 to 60 g/m².

15. The image receiving material as claimed in claim 1, wherein the image receiving layer has a thickness in the range of 0.5 to 50 μm.

16. The image receiving material as claimed in claim 1, wherein the support of the image receiving material is a paper support.

* * * * *